(12) United States Patent
Takei et al.

(10) Patent No.: US 8,366,294 B2
(45) Date of Patent: Feb. 5, 2013

(54) LIGHT-EMITTING DEVICE, LIGHT-EMITTING MODULE, AND METHOD FOR MANUFACTURING LIGHT-EMITTING DEVICE

(75) Inventors: Tomoyuki Takei, Ichihara (JP); Hisayuki Miki, Ichihara (JP)

(73) Assignee: Showa Denko K.K., Tokyo (JP)

( * ) Notice: Subject to any disclaimer, the term of this patent is extended or adjusted under 35 U.S.C. 154(b) by 48 days.

(21) Appl. No.: 13/142,171

(22) PCT Filed: Dec. 16, 2009

(86) PCT No.: PCT/JP2009/070991
§ 371 (c)(1),
(2), (4) Date: Jun. 24, 2011

(87) PCT Pub. No.: WO2010/073950
PCT Pub. Date: Jul. 1, 2010

(65) Prior Publication Data
US 2011/0255281 A1    Oct. 20, 2011

(30) Foreign Application Priority Data

Dec. 25, 2008 (JP) ................................. 2008-331579

(51) Int. Cl.
*F21V 7/00* (2006.01)
*H01L 33/60* (2010.01)
(52) U.S. Cl. ...................... 362/235; 438/27; 362/296.01; 257/E33.072
(58) Field of Classification Search .................. 362/84, 362/487, 235, 296.01; 438/27; 257/E33.072
See application file for complete search history.

(56) References Cited

U.S. PATENT DOCUMENTS

| 2006/0022216 A1 | 2/2006 | Chikugawa | |
| 2012/0044667 A1* | 2/2012 | Hanawa et al. | 362/97.1 |

FOREIGN PATENT DOCUMENTS

| JP | 2006-049442 A | 2/2006 |
| JP | 2007-214471 A | 8/2007 |
| JP | 2008-108836 A | 5/2008 |

* cited by examiner

*Primary Examiner* — Tracie Y Green
(74) *Attorney, Agent, or Firm* — Sughrue Mion, PLLC

(57) ABSTRACT

A light-emitting chip (22) includes: a container (30) having a concave portion (31); first to fourth lead portions (61) to (64), provided to be exposed to the concave portion (31); and a first blue LED to a fourth blue LED (74) mounted on the first to fourth lead portions (61) to (64) exposed to the concave portion (31). The container (30) includes a first container portion (40) covering the region of the concave portion (31) where the first to fourth lead portions (61) to (64) are not exposed, and a second container portion (50) contacting the first to fourth lead portions (61) to (64) without being exposed to the concave portion (31) and accommodating the first container portion (40). The first container portion (40) is formed of a material having higher light reflectivity than that of the second container portion (50), and the second container portion (50) is formed of a material having higher thermal conductivity than that of the first container portion (40). Thus, a decrease in extraction efficiency for light emitted from a light-emitting element can be suppressed, and a rise in the temperature of the light-emitting element in response to the light emission can be suppressed.

18 Claims, 11 Drawing Sheets

LIGHT-EMITTING DEVICE, LIGHT-EMITTING MODULE, AND METHOD FOR MANUFACTURING LIGHT-EMITTING DEVICE

TECHNICAL FIELD

The present invention relates to a light-emitting device and a light-emitting module using light-emitting elements, and a method for manufacturing a light-emitting device using the same.

BACKGROUND ART

In recent years, various light-emitting devices using light-emitting elements, such as light-emitting diodes (LEDs), have become commercially practical. In such a light-emitting device, light-emitting elements are attached to an inner side of a concave portion that is provided for a container made of a resin, for example, and this inner side is used as a reflection surface of light emitted from the light-emitting elements. Here, at the bottom surface of the concave portion, a metal lead portion for feeding power to the light-emitting elements is formed so as to be exposed.

In such a light-emitting device, more heat is generated as output of the light-emitting diodes becomes higher, and the temperature increases as more heat is generated. This results in a decrease in brightness of the light-emitting diodes.

As a conventional art described in an official gazette, there is a container of a light-emitting device composed of a first resin portion and a second resin portion. Here, the first resin portion is formed of a first resin on a side of a lead frame where light-emitting diodes are mounted, and the second resin portion is formed of a second resin on a surface of the lead frame where the light-emitting diodes are not mounted, the second resin having a coefficient of thermal conductivity higher than the first resin (see Patent Document 1).

Patent Document 1: Japanese Patent Application Laid-Open Publication No. 2008-108836

DISCLOSURE OF THE INVENTION

Problems to be Solved by the Invention

A resin material having high thermal conductivity is typically formed by mixing a filler for ensuring the thermal conductivity into a resin of a base material. In general, a resin material having high thermal conductivity causes light absorption as a consequence of the filler, which may result in a tendency to decrease the reflectance.

For this reason, if a configuration is employed in which the second resin portion is exposed to the concave portion provided for the container, extraction efficiency for light in the light-emitting device may decrease because some of light emitted from the light-emitting diodes is absorbed to the second resin portion.

An object of the present invention is to suppress a decrease in extraction efficiency for light emitted from a light-emitting element and to suppress a rise in the temperature of the light-emitting element in response to the light emission.

Means for Solving the Problems

In order to attain the above object, a light-emitting device to which the present invention is applied includes: a container having a concave portion; a metal conductor portion provided so as to have one edge exposed to the concave portion of the container and have the other edge exposed to outside of the container; and a light-emitting element attached to one surface of the metal conductor portion exposed to inside of the concave portion, the light-emitting element being electrically connected to the metal conductor portion. The container includes: a first container portion provided so as to cover a region of the concave portion to which the metal conductor portion is not exposed, the first container portion forming the concave portion together with the metal conductor portion; and a second container portion contacting the other surface of the metal conductor portion without being exposed to the concave portion, the second container portion accommodating the first container portion. The first container portion is set to have higher light reflectivity for light emitted from the light-emitting element than the second container portion, and the second container portion is set to have higher thermal conductivity for heat conducted from the light-emitting element than the first container portion.

In such a light-emitting device, the second container portion may be in contact with the metal conductor portion on the rear side of the region of the metal conductor portion to which the light-emitting element is attached.

The first container portion may be formed of a resin material whitened by using a white pigment.

Additionally, the second container portion may be formed of a resin material having a coefficient of thermal conductivity of not less than 2 W/mK nor more than 20 W/mK.

Furthermore, the first container portion and the second container portion may be respectively formed of resin materials having insulation.

The first container portion and the second container portion respectively may have volume resistivities of $10^{15}$ Ωcm or more.

In another aspect of the present invention, a light-emitting module to which the present invention is applied includes: a substrate; and a plurality of light-emitting devices attached to the substrate. Each of the light-emitting devices includes: a container having a concave portion; a metal conductor portion provided so as to have one edge exposed to the concave portion of the container and have the other edge exposed to outside of the container; and a light-emitting element attached to one surface of the metal conductor portion exposed to inside of the concave portion, the light-emitting element being electrically connected to the metal conductor portion. The container includes: a first container portion provided so as to cover a region of the concave portion to which the metal conductor portion is not exposed, the first container portion forming the concave portion together with the metal conductor portion; and a second container portion contacting the other surface of the metal conductor portion without being exposed to the concave portion, the second container portion accommodating the first container portion. The first container portion is set to have higher light reflectivity for light emitted from the light-emitting element than the second container portion, and the second container portion is set to have higher thermal conductivity for heat conducted from the light-emitting element than the first container portion.

In such a light-emitting module, the second container portion may be in contact with the metal conductor portion on the rear side of the region of the metal conductor portion to which the light-emitting element is attached.

The first container portion may be formed of a resin material whitened by using a white pigment.

Additionally, the second container portion may be formed of a resin material having a coefficient of thermal conductivity of not less than 2 W/mK nor more than 20 W/mK.

Furthermore, the first container portion and the second container portion may be respectively formed of resin materials having insulation.

The first container portion and the second container portion respectively may have volume resistivities of $10^{15}$ Ωcm or more.

In a further aspect of the present invention, a method for manufacturing a light-emitting device to which the present invention is applied includes the steps of: forming a first container portion in a lead frame having a front surface and a rear surface, the first container portion including a concave portion to which the front surface of the lead frame is partially exposed and an opening portion to which the rear surface of the lead frame is partially exposed; forming a second container portion in the lead frame in which the first container portion is formed, the second container portion including a projection portion contacting the rear surface of the lead frame through the opening portion, the second container portion being not exposed to the concave portion; and mounting a light-emitting element on the front surface of the lead frame exposed to the concave portion. In the step of forming the first container portion, the first container portion is formed which has higher light reflectivity for light emitted from the light-emitting element than the second container portion, and in the step of forming the second container portion, the second container portion is formed which has higher thermal conductivity for heat conducted from the light-emitting element than the first container portion.

In such a method for manufacturing a light-emitting device, in the step of forming the first container portion, the opening portion may be formed on the rear side of a position in the lead frame exposed to the concave portion, the position being a target of attachment of the light-emitting element.

In the step of forming the first container portion, the first container portion may be formed of a resin material whitened by using a white pigment.

Additionally, in the step of forming the second container portion, the second container portion may be formed of a resin material having a coefficient of thermal conductivity set at not less than 2 W/mK nor more than 20 W/mK by use of a thermally conductive filler.

Furthermore, in the step of forming the first container portion, the first container portion may be formed of a resin material having a volume resistivity of $10^{15}$ Ωcm or more, and in the step of forming the second container portion, the second container portion may be formed of a resin material having a volume resistivity of $10^{15}$ Ωcm or more.

The method may further include the step of forming a sealing portion for sealing the light-emitting element in the concave portion on which the light-emitting element is mounted.

Advantages of the Invention

According to the present invention, it is possible to suppress a decrease in extraction efficiency for light emitted from a light-emitting element and to suppress a rise in the temperature of the light-emitting element in response to the light emission.

BEST MODES FOR CARRYING OUT THE INVENTION

Hereinafter, an exemplary embodiment of the present invention will be described in detail with reference to the accompanying drawings.

FIGS. 1A and 1B are diagrams for illustrating an example of a configuration of a lighting device 10 to which the present exemplary embodiment is applied. FIG. 1A is a front elevational view of the lighting device 10 seen from a side to be irradiated, while FIG. 1B is a side elevational view of the lighting device 10.

This lighting device 10 includes: a light-emitting module 11 including a substrate 21 on which interconnects, through-holes and the like are formed and plural light-emitting chips 22 attached to the front surface of the substrate 21; and a shade 12 having a concave shape in the cross section thereof and formed so that the light-emitting module 11 may be attached to the bottom of the inside of the concave. Additionally, the lighting device 10 further includes a heat radiation member 13 disposed so as to be sandwiched between the rear surface of the substrate 21 of the light-emitting module 11 and the bottom of the inside of the concave of the shade 12. The light-emitting module 11 and the heat radiation member 13 are attached and fixed to the shade 12 with metallic screws 14. For this reason, screw holes (not shown) are formed in the substrate 21 so as to correspond to positions to which the screws 14 are attached. The lighting device 10 may be provided with a diffusion lens to make light emitted from the light-emitting chips 22 be uniform, and the like, as necessary.

The substrate 21 is formed of a copper clad epoxy laminate based on glass fabrics (a glass epoxy substrate) or the like, for example, and has a rectangular shape. Interconnects to electrically connect the plural light-emitting chips 22 are formed inside of the substrate 21, and a white resist film is formed by coating on the surface of the substrate 21. The interconnects of the substrate 21 are formed so as to leave copper foil having as much area as possible, in order that both of the front and rear surfaces have better heat radiation characteristics. The front and rear surfaces are electrically and thermally continuous with the through-holes. Note that a metallic film may be formed by vapor deposition or the like, instead of the white resist film.

A total of forty-two light-emitting chips 22, each of which is an example of a light-emitting device, consisting of three rows in the lateral direction of the substrate 21 and fourteen columns in the longitudinal direction thereof are attached to the surface of the substrate 21.

Furthermore, the shade 12 is formed of a metallic plate subjected to a bending process, for example, and has the inside of the concave portion thereof painted white. The shade 12 is electrically grounded when the lighting device 10 is made. Note that a metallic film may be formed by vapor deposition or the like on the inside of the concave portion of the shade 12, instead of the white painted film.

FIGS. 2 to 3B are diagrams for illustrating an example of a configuration of the light-emitting chips 22 shown in FIGS. 1A and 1B. FIG. 2 is a top view of the light-emitting chip 22 seen from the side of a light-emitting surface. FIG. 3A is a cross-sectional view taken along the IIIA-IIIA line in FIG. 2, while FIG. 3B is a cross-sectional view taken along the IIIB-IIIB line in FIG. 2.

The light-emitting chip 22 includes: a container 30 having a concave portion 31 formed on one side thereof; a first lead portion 61, a second lead portion 62, a third lead portion 63 and a fourth lead portion 64 that each are an example of a metal conductor portion and a metal lead portion and are integrated with the container 30; a first blue LED 71, a second blue LED 72, a third blue LED 73 and a fourth blue LED 74 that each are an example of a light-emitting element and are attached to the inside of the concave portion 31; and a sealing portion 80 provided so as to cover the concave portion 31. The concave portion 31 has a trapezoidal cross section. The concave portion 31 includes: a bottom surface 32 to which the first blue LED 71, the second blue LED 72, the third blue LED 73 and the fourth blue LED 74 are attached; and wall surfaces 33 spreading upward from the outer edge of the bottom surface 32. In FIG. 2, illustration of the sealing portion 80 is omitted. Additionally, the light-emitting chip 22 further includes four lead pieces 65a, 65b, 66a and 66b integrated with the container 30.

The container 30 is formed by injection molding of a thermoplastic resin over a lead frame 60 (see FIG. 5 to be described later) that is formed by integrating the first lead portion 61, the second lead portion 62, the third lead portion 63 and the fourth lead portion 64 with the four lead pieces 65a, 65b, 66a and 66b. The container 30 includes: a first container portion 40 that forms the bottom surface 32 together with the first lead portion 61, the second lead portion 62, the third lead portion 63 and the fourth lead portion 64 and forms the wall surfaces 33 by itself; and a second container portion 50 formed outside of the first container portion 40 except for the top surface side of the concave portion 31.

The first lead portion 61, the second lead portion 62, the third lead portion 63 and the fourth lead portion 64 and the four lead pieces 65a, 65b, 66a and 66b are formed of a metal plate having a thickness of about 0.1 to 0.5 mm, and are formed by stacking several μm of nickel, titanium, gold, silver or the like as a plated layer on a base made of an alloy of iron and copper, for example, as metals having excellent formability and thermal conductivity. To improve extraction efficiency for light from the light-emitting chips 22, it is preferable to use a metal plate coated with plating of silver that absorbs less light in the visible region. Note that the first to fourth lead portions 61 to 64 and the four lead pieces 65a, 65b, 66a and 66b are made by blanking one metal plate, as will be described later. For this reason, the surfaces of the first to fourth lead portions 61 to 64 and the four lead pieces 65a, 65b, 66a and 66b are placed at almost the same height.

In the present exemplary embodiment, each of the first to fourth lead portions 61 to 64 is partially exposed to the bottom surface 32 of the concave portion 31. Additionally, the first container portion 40 is exposed to the region of the bottom surface 32 of the concave portion 31 where the first to fourth lead portions 61 to 64 are not exposed. In the present exemplary embodiment, a reflection surface is formed by the surfaces of the first to fourth lead portions 61 to 64 and the surface of the first container portion 40 that are exposed to the concave portion 31. Additionally, one end side of each of the first to fourth lead portions 61 to 64 is formed so as to protrude from an outer side wall of the container 30, and is bent from the outer wall surface of the container 30 to the rear surface side opposite to the front surface side on which the concave portion 31 is formed.

The first blue LED 71, the second blue LED 72, the third blue LED 73 and the fourth blue LED 74 are respectively fixed, with unillustrated paste for die bonding, to the first lead portion 61, the second lead portion 62, the third lead portion 63 and the fourth lead portion 64 that are exposed to the bottom surface 32. Additionally, the first to fourth lead portions 61 to 64 are connected in series or in parallel to the first to fourth blue LEDs 71 to 74 with unillustrated bonding wires. Note that the fourth lead portion 64 is used as a cathode electrode in this specific example.

The light-emitting layers of the first to fourth blue LEDs 71 to 74 have a configuration containing InGaN (indium gallium nitride), and emit blue light (Note that InGaN is a generic name of those having arbitrary relative ratios as composition ratios of each element.).

The sealing portion 80 is formed of a transparent resin having a high light transmissivity for wavelengths in the visible region and having a high refractive index. The front surface side of the sealing portion 80 may be selected from a flat surface, a depressed surface or a convex surface. A resin having characteristics of high heat resistance, weather resistance and mechanical strength, such as an epoxy resin and a silicone resin, for example, may be used for the resin forming the sealing portion 80. In the present exemplary embodiment, the transparent resin forming the sealing portion 80 contains a phosphor converting some of blue light emitted from the first to fourth blue LEDs 71 to 74 into green light and red light. Note that, instead of such a phosphor, the transparent resin may contain a phosphor converting some of the blue light into yellow light or a phosphor converting some of the blue light into yellow light and red light. Alternatively, a configuration without a phosphor may be employed as a matter of course.

Next, the configuration of the container 30 is more specifically described.

As described above, the container 30 includes: the first container portion 40 forming the concave portion 31 together with the first to fourth lead portions 61 to 64; and the second container portion 50 accommodating the first container portion 40 on the backside of the first container portion 40, namely, on the side opposite to the concave portion 31. When seen from above as shown in FIG. 2, the first container portion 40 has a circular outer shape while the second container portion 50 has a rectangular outer shape. Note that the first to fourth lead portions 61 to 64 penetrate the first container portion 40 and the second container portion 50 to protrude to the outside of a side portion of the container 30, and are bent to the rear surface side along the front surface of the second container portion 50. Meanwhile, the four lead pieces 65a, 65b, 66a and 66b are sandwiched into the second container portion 50.

The first container portion 40, which is an example of a first resin member, has a substantially concave cross section, and the wall surfaces 33 spreading upward from the side of the bottom surface 32 are formed inside of the first container portion 40. A circular depression is provided at the center of the bottom surface 32, and a circular protrusion is provided at the rear side thereof.

Additionally, as shown in FIGS. 2 and 3A, the first container portion 40 is exposed to the region of the bottom surface 32 where the first to fourth lead portions 61 to 64 do not exist. On the other hand, as shown in FIGS. 2 and 3B, in the region of the bottom surface 32 where the first to fourth lead portions 61 to 64 exist, on the rear surface side of the region where the first to fourth blue LEDs 71 to 74 are die-bonded, the first container portion 40 is not formed but a first opening portion 41, a second opening portion 42, a third opening portion 43 and a fourth opening portion 44 (see FIG. 7 to be described later), each of which is an example of an opening portion, are provided. Note that each of the first to fourth opening portions 41 to 44 is square, and spreads more as the distance from the first to fourth lead portions 61 to 64 increases.

It is preferable to use, for the first container portion 40, a resin material whose percentage of white pigment content, particle diameter and the like are adjusted so that the reflectance of visible light is not less than 85% nor more than 98%, for example. In other words, the absorptance of visible light of the first container portion 40 is less than 15%. As the white pigment, it is preferable to employ fine-grained titania (titanium oxide). Titania has a high refractive index and a low absorptance of light compared to other white pigments, and thus is preferably used for the first container portion 40 of the present exemplary embodiment. Other white pigments, for example, aluminum oxide, zinc oxide or the like may be used.

The first container portion 40 is also used for insulation between the first to fourth lead portions 61 to 64. For this reason, it is preferable for the first container portion 40 to have a volume resistivity of $10^{15}$ Ωcm or more, for example.

Further, since there are plural steps in the manufacturing process, in which temperature is applied, such as solder reflow, it is preferable to select a known material for the resin forming the first container portion 40 in due consideration of heat resistance. As a resin for the base material of the first container portion 40, polyamide, liquid crystal polymer or the like may be used, and, for example, Genestar (KURARAY CO., LTD.), AMODEL (Solvay Advanced Polymers) or the like may be preferably used.

In contrast, the second container portion 50, which is an example of a second resin member, also has a substantially concave cross section. The second container portion 50 accommodates the first container portion 40 therein, or completely therein, which is particularly preferable. Additionally, the outer wall surfaces and the bottom surface of the first container portion 40 are in close contact with the inner wall surfaces and the bottom surface of the second container portion 50, respectively.

As shown in FIGS. 2 and 3A, the second container portion 50 is not exposed to the region of the bottom surface 32 where the first to fourth lead portions 61 to 64 do not exist. On the other hand, as shown in FIGS. 2 and 3B, in the region of the bottom surface 32 where the first to fourth lead portions 61 to 64 exist, at the first to fourth opening portions 41 to 44 formed on the rear surface side of the region where the first to fourth blue LEDs 71 to 74 are die-bonded, a first projection portion 51, a second projection portion 52, a third projection portion 53 and a fourth projection portion 54 of the second container portion 50, each of which is an example of a projection portion, are formed so as to fill the respective opening portions, and are in contact with the respective rear surface sides of the first to fourth lead portions 61 to 64.

It is preferable to use, for the second container portion 50, a material having higher thermal conductivity than that of the first container portion 40, and to use a resin material having a coefficient of thermal conductivity of not less than 2 W/mK nor more than 20 W/mK, for example, at a room temperature.

The second container portion 50 is also used for insulation between the first to fourth lead portions 61 to 64, as with the first container portion 40. For this reason, it is desirable for the second container portion 50 to have a volume resistivity of $10^{15}$ Ωcm or more, for example.

Further, since there are plural steps in the manufacturing process, in which temperature is applied, such as solder reflow, it is preferable to select a known material for the resin forming the second container portion 50 in due consideration of heat resistance, as with the resin forming the first container portion 40. As a resin for the base material of the second container portion 50, polyamide, nylon, liquid crystal polymer or the like may be used. For example, PPS resin, liquid crystal polymer or the like containing an insulating thermally conductive filler, for example, may be used, and G142Z1, G141Z1, G131Z1 (Idemitsu Kosan Co., Ltd.) or the like may be preferably used.

Additionally, it is desirable that base materials of the first container portion 40 and the second container portion 50 be identical resins in order to enhance adhesion between the first container portion 40 and the second container portion 50 forming the container 30.

It is preferable that light reflectance of the first container portion 40 for light having an emission wavelength of the first to fourth blue LEDs 71 to 74 be higher than that of the second container portion 50 for light having the same emission wavelength. Note that the resin forming the second container portion 50 generally has a lower light reflectance for visible light than the first container portion 40 due to an effect of a thermally conductive filler added to enhance thermal conductivity. Thus, the second container portion 50 tends to exhibit gray or black, while the first container portion 40 exhibits white.

Now, operations of the lighting device 10 shown in FIGS. 1A and 1B are described.

When a current is supplied from outside to the light-emitting module 11 of the lighting device 10, white light is emitted from the forty-two light-emitting chips 22. The white light emitted from the light-emitting chips 22 is applied to space or an object directly or after being reflected on the substrate 21 or the shade 12.

Next, operations of the light-emitting chip 22 shown in FIGS. 2 to 3B are described.

When a current is supplied to the light-emitting chip 22 via the first to fourth lead portions 61 to 64, a DC forward current flows through the first to fourth blue LEDs 71 to 74 electrically connected to these lead portions. As a result, each of the first to fourth blue LEDs 71 to 74 provided for the light-emitting chip 22 emits blue light. The blue light emitted from the first to fourth blue LEDs 71 to 74 proceeds within the sealing portion 80, namely, within the concave portion 31, and is emitted from an emitting surface provided on the upper side of the sealing portion 80 to outside directly or after being reflected on the bottom surface 32 or the wall surface 33. However, some of light heading for the emitting surface reflects on the emitting surface, and proceeds within the sealing portion 80 again. During this time, in the sealing portion 80, some of the blue light is converted into green light and red light by the phosphor, and the converted green light and red light are emitted from the emitting surface to outside together with the blue light directly or after being reflected on the bottom surface 32 or the wall surface 33. Accordingly, white light including the blue light, the green light and the red light is emitted from the sealing portion 80.

On the other hand, heat generated in the first to fourth blue LEDs 71 to 74 along with the light emission is conducted to the first to fourth lead portions 61 to 64 to which the respective LEDs are attached.

In the present exemplary embodiment, the first to fourth projection portions 51 to 54 of the second container portion 50 having better thermal conductivity than the first container portion 40 are brought into contact with the rear surface side of those mounted positions on the first to fourth lead portions 61 to 64 on which the first to fourth blue LEDs 71 to 74 are mounted on the front surface side exposed to the bottom surface 32. By this configuration, heat conducted from the first to fourth blue LEDs 71 to 74 to the front surface side of the first to fourth lead portions 61 to 64 is then conducted from just behind these lead portions to the second container portion 50 via the first to fourth projection portions 51 to 54. The conducted heat is emitted from the outer surface of the second container portion 50 into the atmosphere. Meanwhile, some of the heat of the first to fourth lead portions 61 to 64 is conducted to the region exposed to the outside of the container 30, and is emitted from the outer surface of the first to fourth lead portions 61 to 64 into the atmosphere.

In the present exemplary embodiment, the bottom surface 32 is composed of the first to fourth lead portions 61 to 64 exhibiting a metallic luster and the first container portion 40 exhibiting white, and the wall surfaces 33 are composed of the first container portion 40. In other words, the second container portion 50 having light absorption properties for visible light is not exposed to the bottom surface 32 and the wall surfaces 33. For this reason, light proceeding within the sealing portion 80 is hardly absorbed into the bottom surface 32 and the wall surfaces 33, and thus extraction efficiency for light from the light-emitting chips 22 can be improved.

Additionally, in the present exemplary embodiment, the first to fourth projection portions 51 to 54 of the second container portion 50 having significantly higher thermal conductivity than the first container portion 40 are arranged in contact with regions on the rear surface side of the first to fourth lead portions 61 to 64 just behind the mounted positions of the first to fourth blue LEDs 71 to 74. By this configuration, the heat generated by the first to fourth blue LEDs 71 to 74 is difficult to remain in the light-emitting chip 22, and the rate of a temperature increase in the first to fourth blue LEDs 71 to 74 slows down. In general, when the temperature of an LED increases, the light emission efficiency thereof is easy to decrease and thereby the amount of emitted light is likely to decrease. Accordingly, by adopting the configuration of the present exemplary embodiment, light emission efficiency of the first to fourth blue LEDs 71 to 74 in the light-emitting chip 22 can be increased.

As described above, by adopting the configuration of the present exemplary embodiment, the light emission efficiency of the first to fourth blue LEDs 71 to 74 themselves and the extraction efficiency for extracting the light emitted from the first to fourth blue LEDs 71 to 74 to outside are increased, and thus the light emission efficiency of the whole light-emitting chip 22 can be significantly increased.

FIG. 4 is a flowchart for illustrating a manufacturing method of the light-emitting chip 22 shown in FIGS. 2 to 3B. FIGS. 5 to 11 are views for illustrating the manufacturing process of the light-emitting chip 22.

First, a lead frame is prepared in which the first to fourth lead portions 61 to 64 and the four lead pieces 65a, 65b, 66a and 66b are integrated through a bridging portion. Note that a lead frame is shaped by blanking one metal plate.

The first container portion 40 is formed by injection molding of a first resin over such a lead frame (Step 101), and the second container portion 50 is then formed by injection molding of a second resin over the lead frame (Step 102), to thereby obtain the container 30. Next, the first to fourth blue LEDs 71 to 74 are respectively mounted on the first to fourth lead portions 61 to 64 that are exposed to the bottom surface 32 (Step 103). On the occasion of mounting, die bonding of the first to fourth blue LEDs 71 to 74 onto the first to fourth lead portions 61 to 64 and wire bonding between the first to fourth lead portions 61 to 64 and the first to fourth blue LEDs 71 to 74 are made. Thereafter, the concave portion 31 is filled with a sealing resin, which is then hardened to form the sealing portion 80 (Step 104).

Next, the first to fourth lead portions 61 to 64 are cut out from the lead frame while each of the first to fourth lead portions 61 to 64 has one end side fixed by the formed container 30 (Step 105). The first to fourth lead portions 61 to 64 having been cut out are bent on the rear surface side of the container 30 (Step 106). Finally, the four lead pieces 65a, 65b, 66a and 66b are cut out from the lead frame (Step 107), and the light-emitting chip 22 is separated from the lead frame, to obtain the light-emitting chip 22.

FIG. 5 shows a top view of the lead frame 60 being a starting material.

This lead frame 60 is obtained by blanking one metal plate, and has the first to fourth lead portions 61 to 64 and the four lead pieces 65a, 65b, 66a and 66b integrated through the bridging portion 67. The lead pieces 65a and 65b are formed so as to project from an edge of a first supporting portion 65 extending from the bridging portion 67, while the lead pieces 66a and 66b are formed so as to project to the side facing the lead pieces 65a and 65b from an edge of a second supporting portion 66 extending from the bridging portion 67.

FIG. 6 shows a top view of the lead frame 60 seen from the side on which the concave portion 31 is formed, the lead frame 60 having the first container portion 40 formed therein in Step 101. FIG. 7 shows a rear view of the lead frame 60. The first container portion 40 is formed so as to sandwich free end sides of the respective first to fourth lead portions 61 to 64 of the lead frame 60 therebetween.

As shown in FIG. 6, on the front surface side of the lead frame 60, the bottom surface 32 is composed of the front surface sides of the respective first to fourth lead portions 61 to 64 and the first container portion 40 exposed from gaps between these lead portions, while the wall surfaces 33 are composed of the first container portion 40. Thereby, the concave portion 31 is provided.

On the other hand, as shown in FIG. 7, on the rear surface side of the lead frame 60, the four opening portions, namely, the first opening portion 41, the second opening portion 42, the third opening portion 43 and the fourth opening portion 44 are formed by the first container portion 40. At this time, the rear surfaces of the first to fourth lead portions 61 to 64 are partially exposed to the bottoms of the first to fourth opening portions 41 to 44, respectively.

FIG. 8 shows a top view of the lead frame 60 seen from the side on which the concave portion 31 is formed, the lead frame 60 having the second container portion 50 formed therein in Step 102. FIG. 9 shows a rear view of the lead frame 60. The second container portion 50 is formed so as to sandwich the two lead pieces 65a and 65b provided for the first supporting portion 65 and the two lead pieces 66a and 66b provided for the second supporting portion 66, in addition to a part of the first to fourth lead portions 61 to 64, outside of the first container portion 40.

As shown in FIG. 8, on the front surface side of the lead frame 60, the second container portion 50 is formed so as to surround the outside of the side portion of the first container portion 40. Note that, at this time, the second container portion 50 is not exposed to the bottom surface 32 and the wall surfaces 33 of the concave portion 31.

On the other hand, as shown in FIG. 9, on the rear surface side of the lead frame 60, the first to fourth opening portions 41 to 44 (see FIG. 7) formed by the first container portion 40 are filled with the second container portion 50, and thereby the first to fourth projection portions 51 to 54 are formed, while the second container portion 50 is exposed to the whole rear surface side of the lead frame 60.

FIG. 10 shows a top view of the lead frame 60 seen from the side on which the concave portion 31 is formed, the lead frame 60 having the first to fourth blue LEDs 71 to 74 mounted thereon in Step 103. The first blue LED 71 is attached to that region of the bottom surface 32 of the concave portion 31 which is on the front surface side of the first lead portion 61 and faces the first opening portion 41 with the first lead portion 61 interposed therebetween, that is, to the region with which the first projection portion 51 of the second container portion 50 is in contact on the rear surface side of the first lead portion 61. The second blue LED 72 is attached to that region of the bottom surface 32 of the concave portion 31 which is on the front surface side of the second lead portion 62 and faces the second opening portion 42 with the second lead portion 62 interposed therebetween, that is, to the region with which the second projection portion 52 of the second container portion 50 is in contact on the rear surface side of the second lead portion 62. Additionally, the third blue LED 73 is attached to that region of the bottom surface 32 of the concave portion 31 which is on the front surface side of the third lead portion 63 and faces the third opening portion 43 with the third lead portion 63 interposed therebetween, that is, to the region with which the third projection portion 53 of the second container portion 50 is in contact on the rear surface side of the third lead portion 63. Furthermore, the fourth blue LED 74 is attached to that region of the bottom surface 32 of the concave portion 31 which is on the front surface side of the fourth lead portion 64 and faces the fourth opening portion 44 with the fourth lead portion 64 interposed therebetween, that is, to the region with which the fourth projection portion 54 of the second container portion 50 is in contact on the rear surface side of the fourth lead portion 64.

Note that formation of the sealing portion 80 in Step 104 is performed after the first to fourth blue LEDs 71 to 74 are mounted.

FIG. 11 shows a top view of the lead frame 60 seen from the side on which the concave portion 31 is formed, the lead frame 60 having the first to fourth lead portions 61 to 64 cut and bent in Steps 105 and 106. In FIG. 11, illustration of the sealing portion 80 is omitted. Here, the fixed end sides of the respective first to fourth lead portions 61 to 64 are first cut out from the bridging portion 67 of the lead frame 60. At this time, the container 30 is integrated with the bridging portion 67 through the lead pieces 65a and 65b provided for the first supporting portion 65 and the lead pieces 66a and 66b provided for the second supporting portion 66, and the first to fourth lead portions 61 to 64 are bent on the backside of the container 30 while the container 30 is fixed by the lead frame 60.

After the first to fourth lead portions 61 to 64 are bent, the first supporting portion 65 and the second supporting portion 66 are respectively cut along A-A and B-B shown in FIG. 11 in Step 107. By this operation, the light-emitting chip 22 can be separated from the lead frame 60, and the light-emitting chip 22 shown in FIGS. 1A to 3B is obtained.

In the present exemplary embodiment, an example has been described in which blue LEDs are used as light-emitting elements; however, the emission color of the light-emitting elements may be appropriately selected. In this case, it is desirable that the first container portion 40 have a reflectance of at least not less than 65%, more preferably not less than 90%, for example, for light of an emission wavelength emitted by the light-emitting elements.

In the present exemplary embodiment, an example has been described in which the lighting device 10 is configured by use of the light-emitting module 11; however the configuration is not limited thereto. The above-described light-emitting module 11 can be applied to, for example, a traffic light, a backlight device such as a liquid crystal display, a light source device of a scanner, an exposure device of a printer, in-car lighting equipment, an LED display device using a dot matrix LED, or the like.

DESCRIPTION OF REFERENCE NUMERALS AND SIGNS

Figure 1:
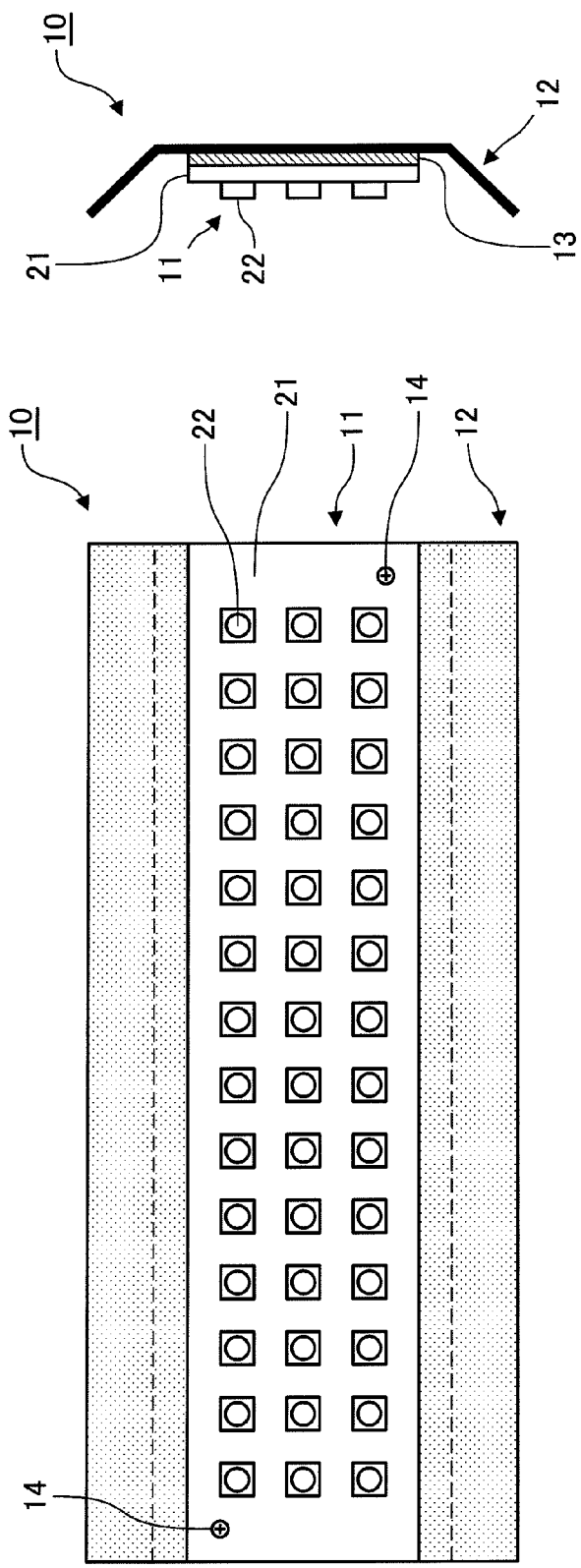
FIGS. 1A and 1B are diagrams for illustrating an example of a configuration of a lighting device to which the exemplary embodiment is applied.
Figure 2:
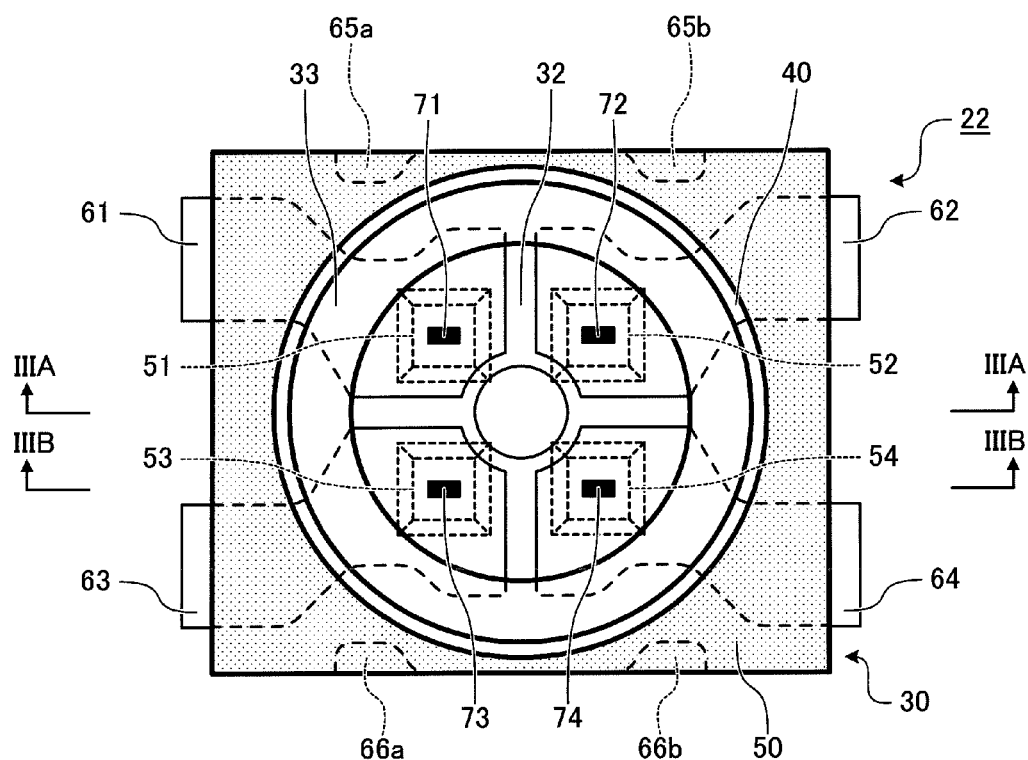
FIG. 2 is a top view of the light-emitting chip seen from the side of a light-emitting surface.
Figure 3A:
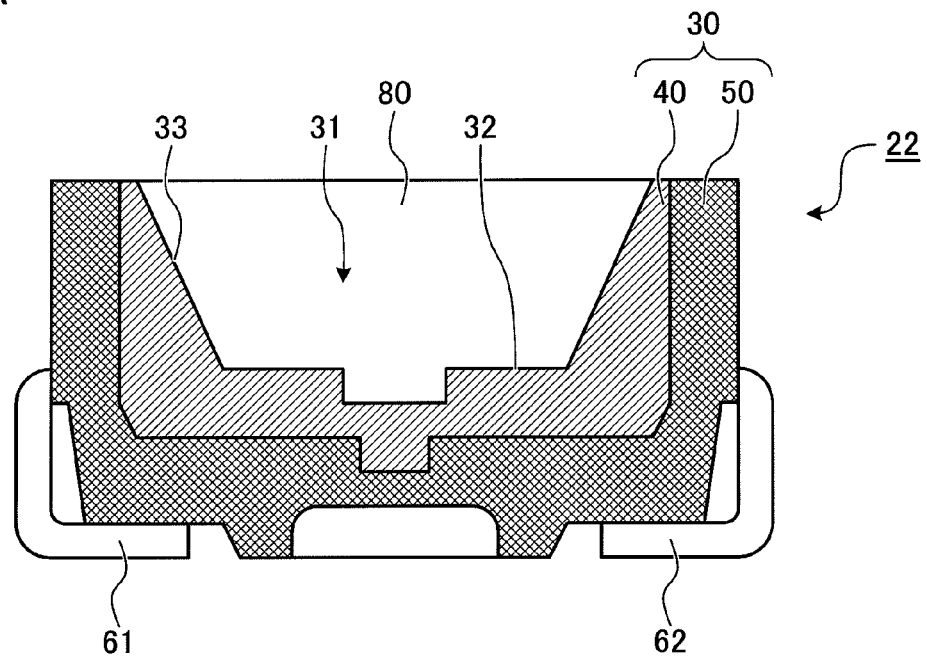
FIGS. 3A and 3B are cross-sectional views taken along the IIIA-IIIA and IIIB-IIIB lines in FIG. 2, respectively.
Figure 3B:
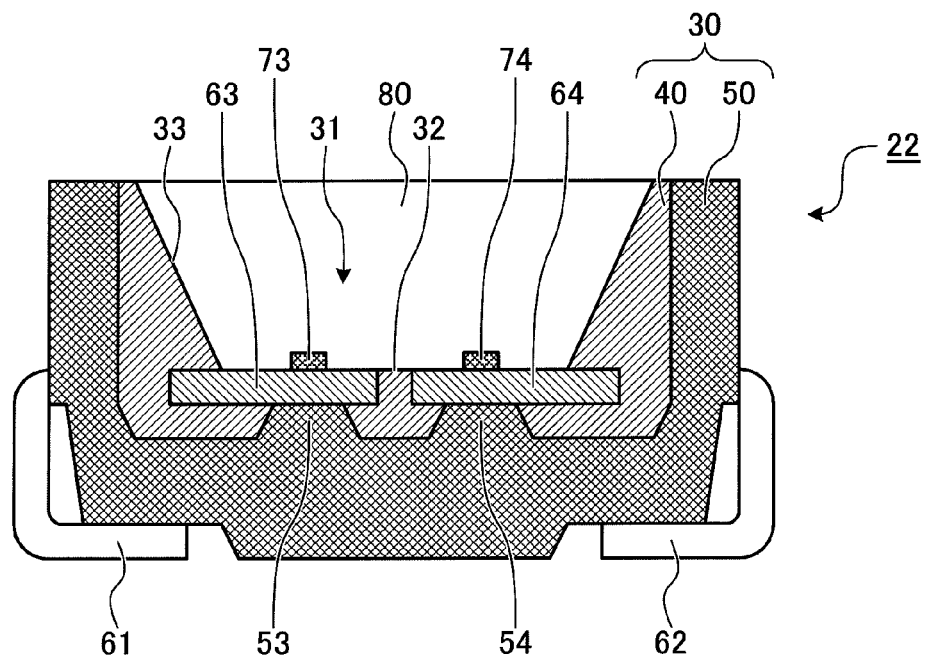
Figure 4:
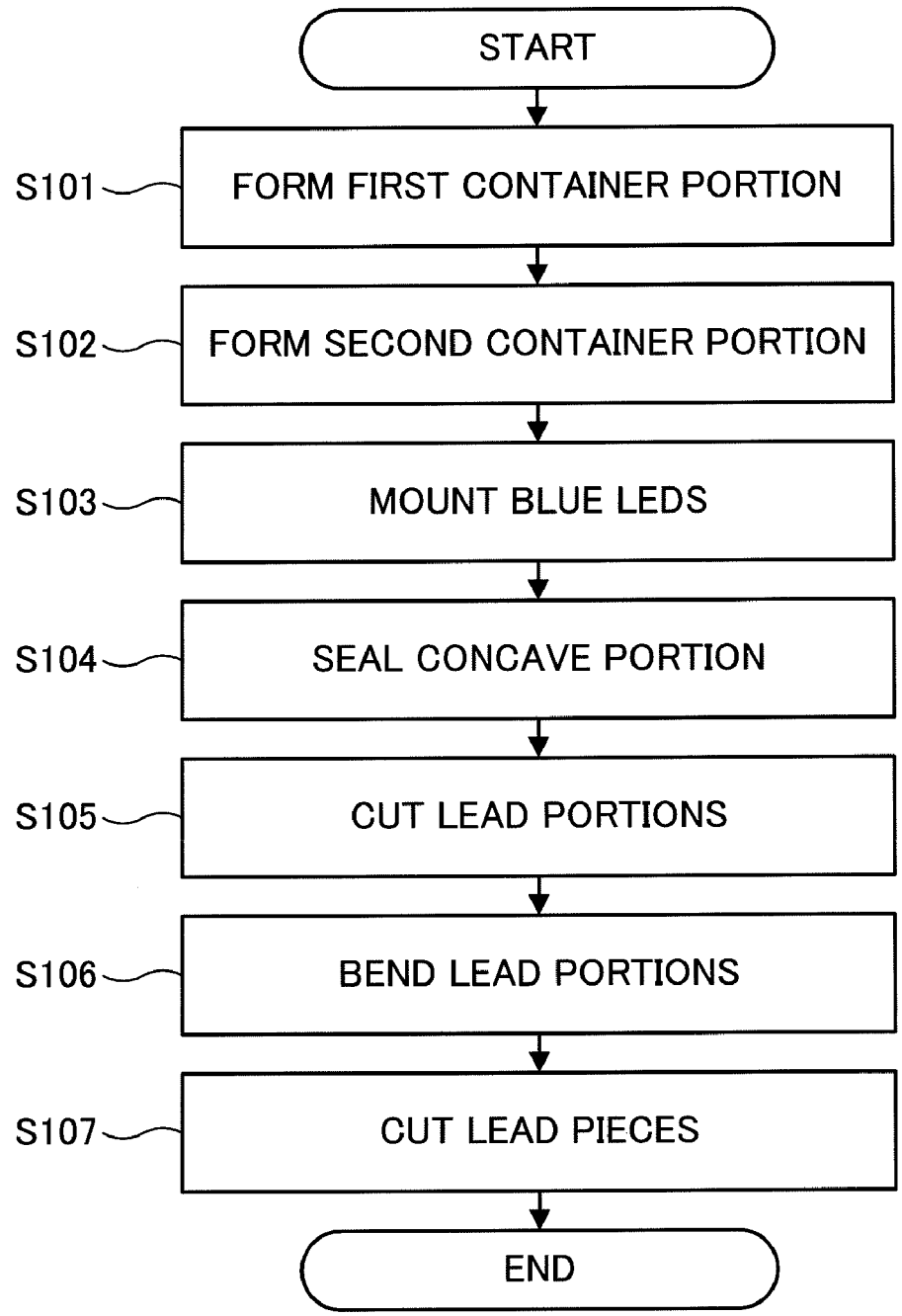
FIG. 4 is a flowchart for illustrating a manufacturing method of the light-emitting chip.
Figure 5:
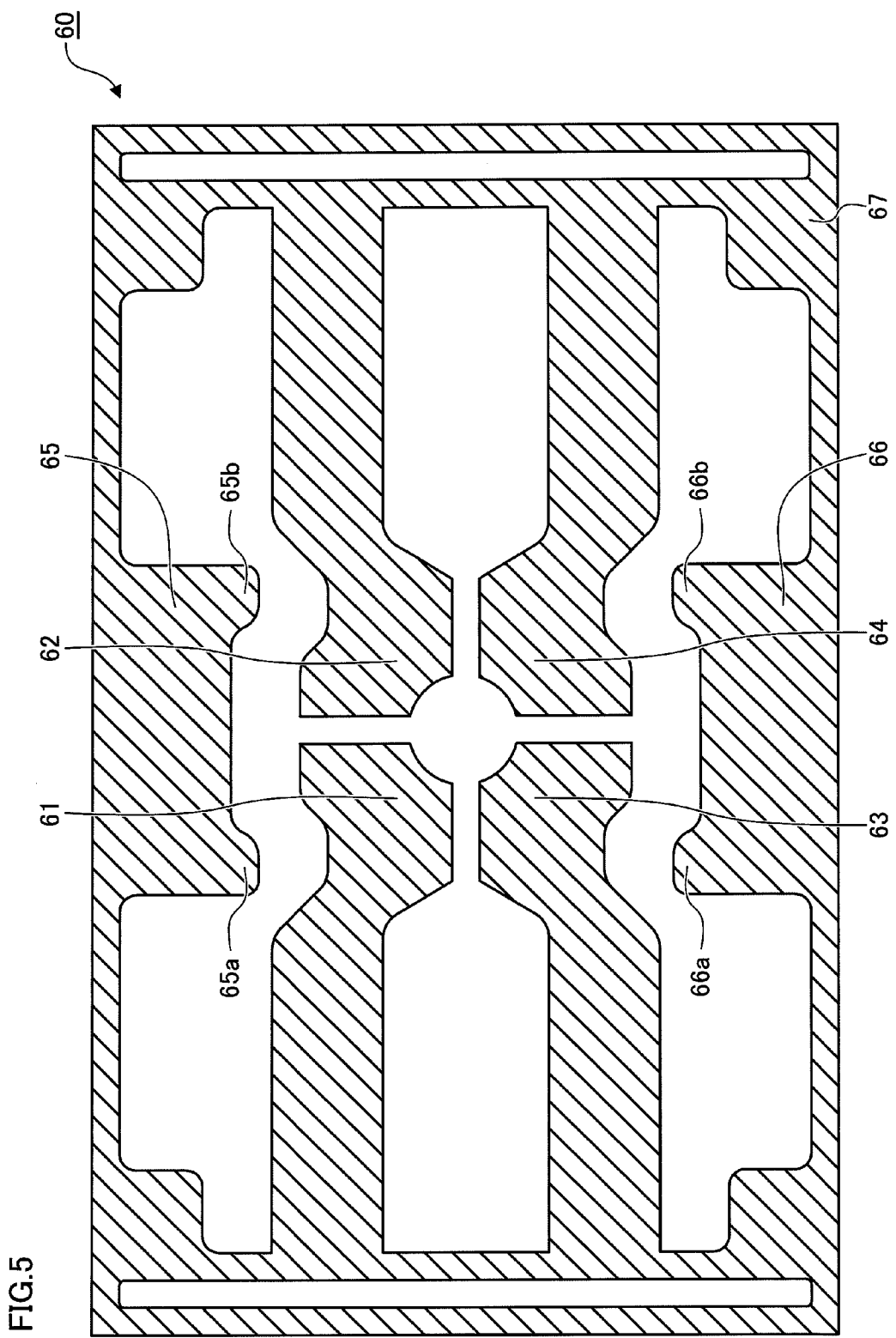
FIG. 5 is a top view of the lead frame.
Figure 6:
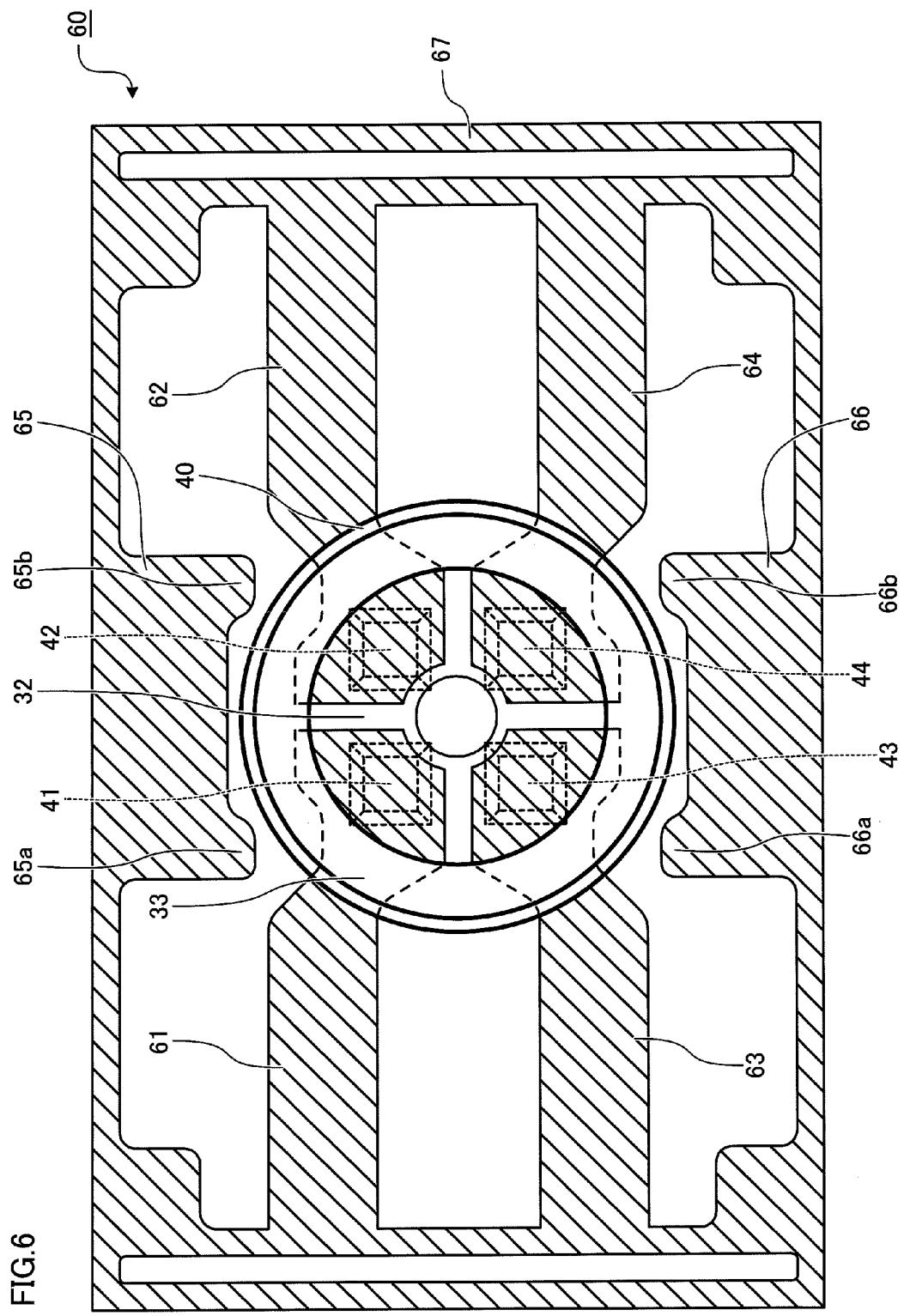
FIG. 6 is a top view of the lead frame with the first container portion formed therein.
Figure 7:
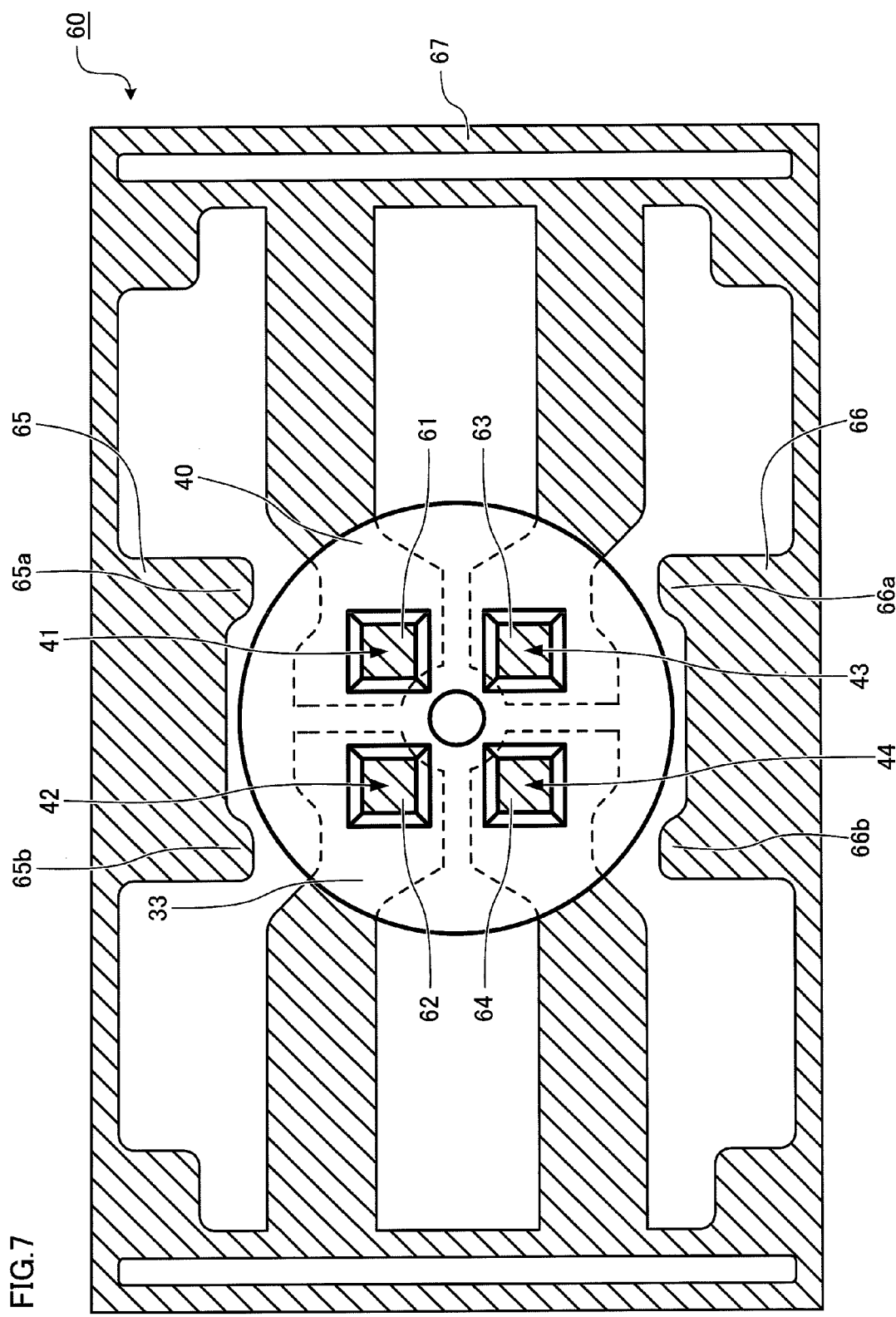
FIG. 7 is a rear view of the lead frame with the first container portion formed therein.
Figure 8:
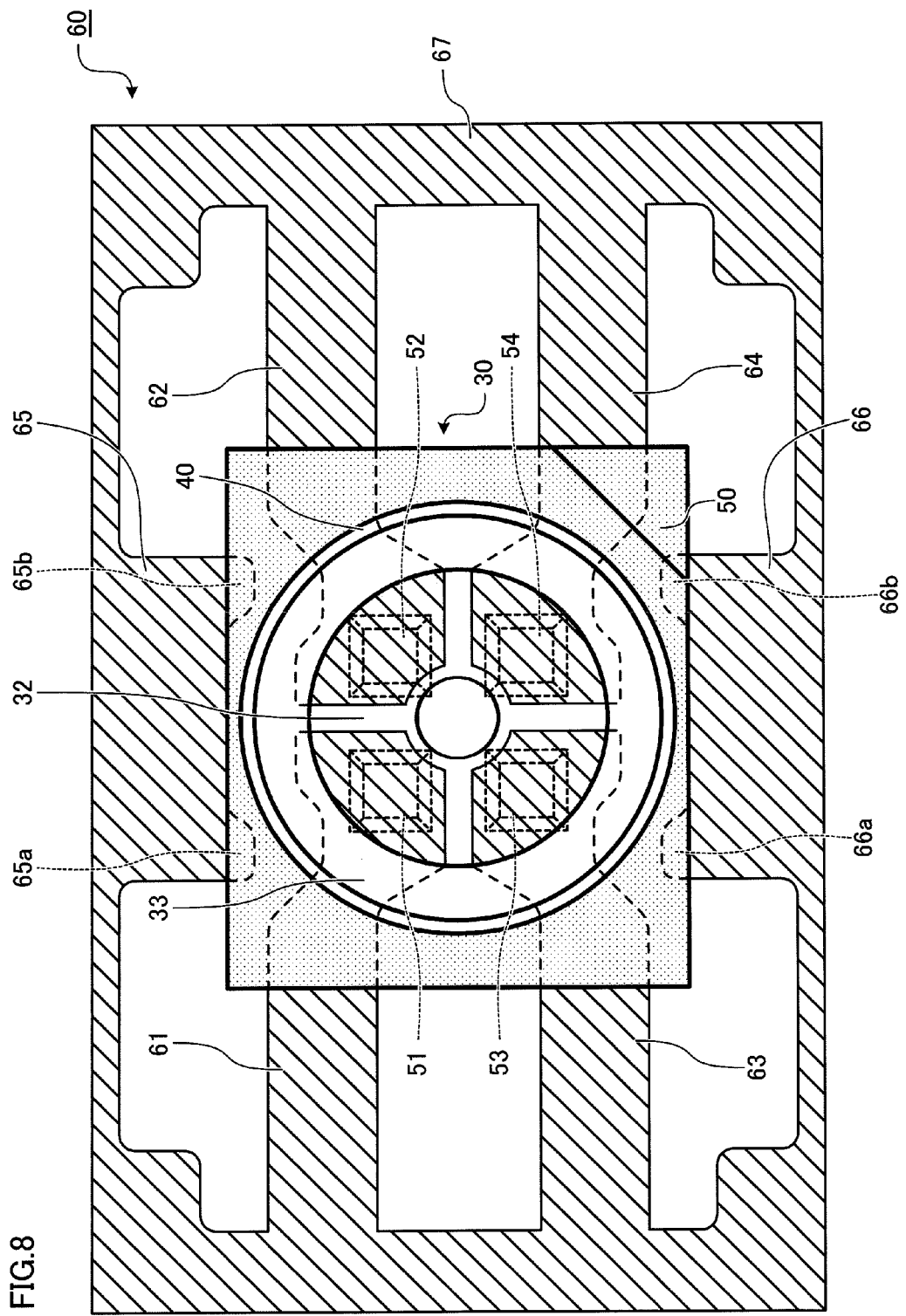
FIG. 8 is a top view of the lead frame with the second container portion formed therein.
Figure 9:
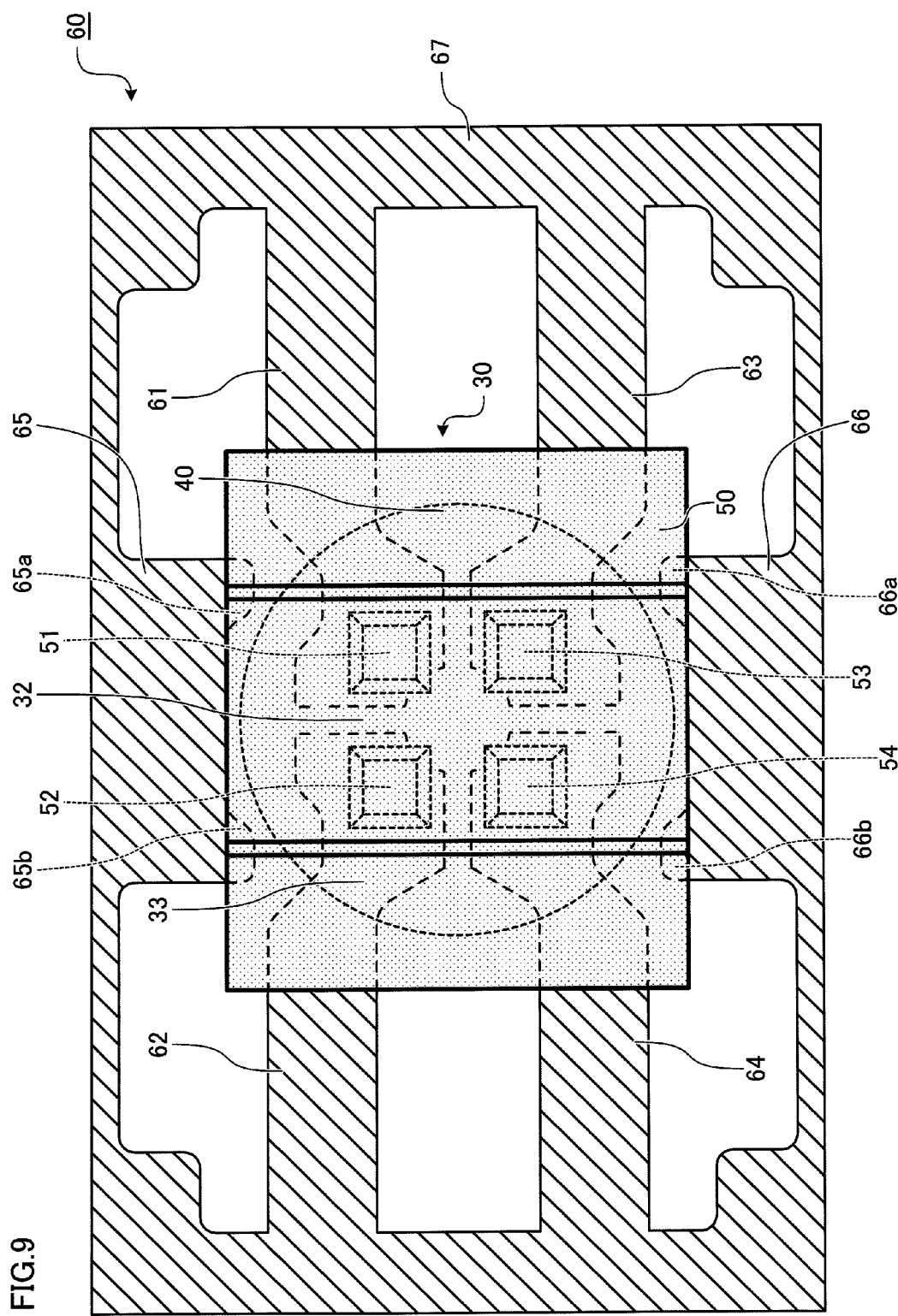
FIG. 9 is a rear view of the lead frame with the second container portion formed therein.
Figure 10:
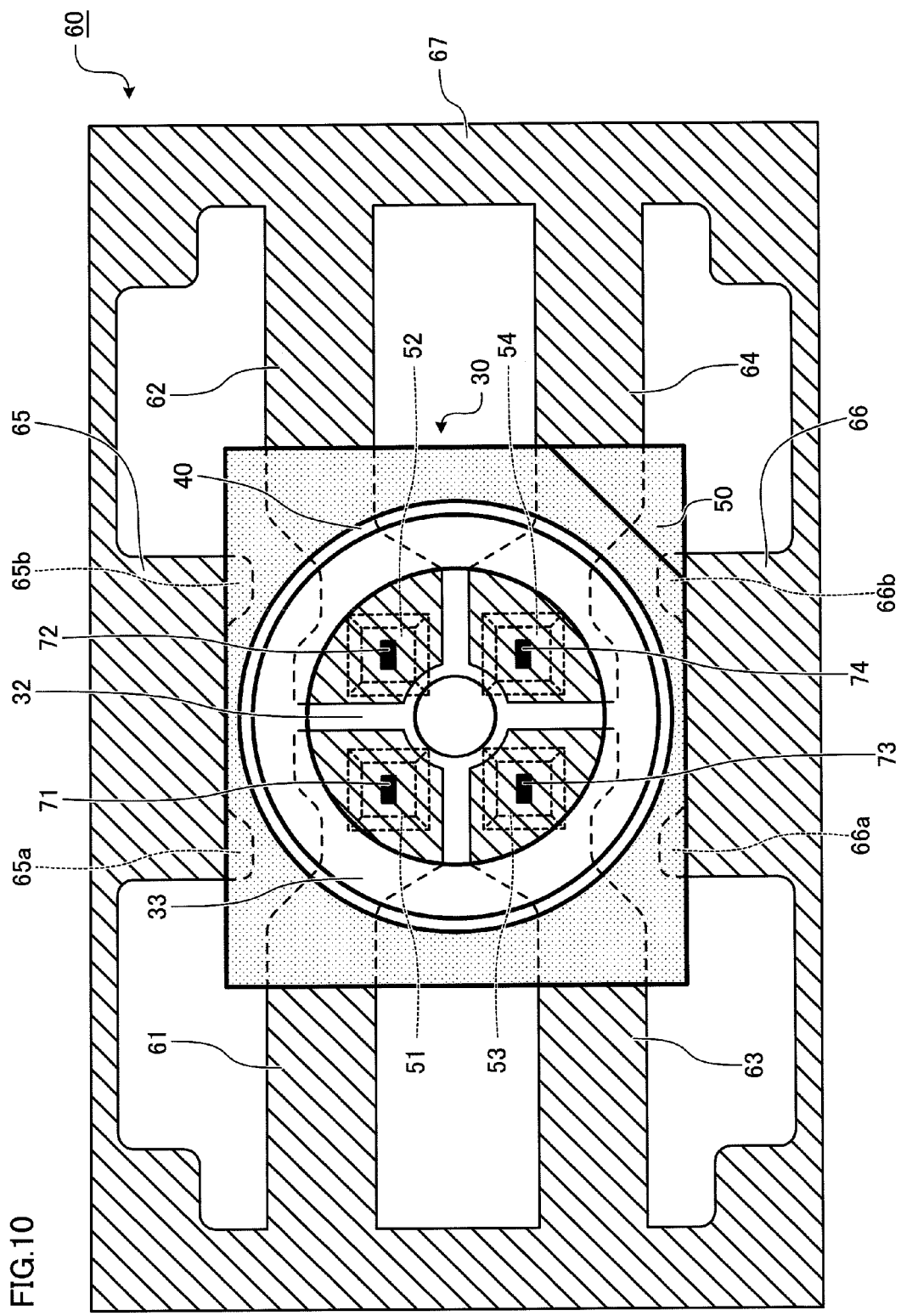
FIG. 10 is a top view of the lead frame with the blue LEDs mounted thereon.
Figure 11:
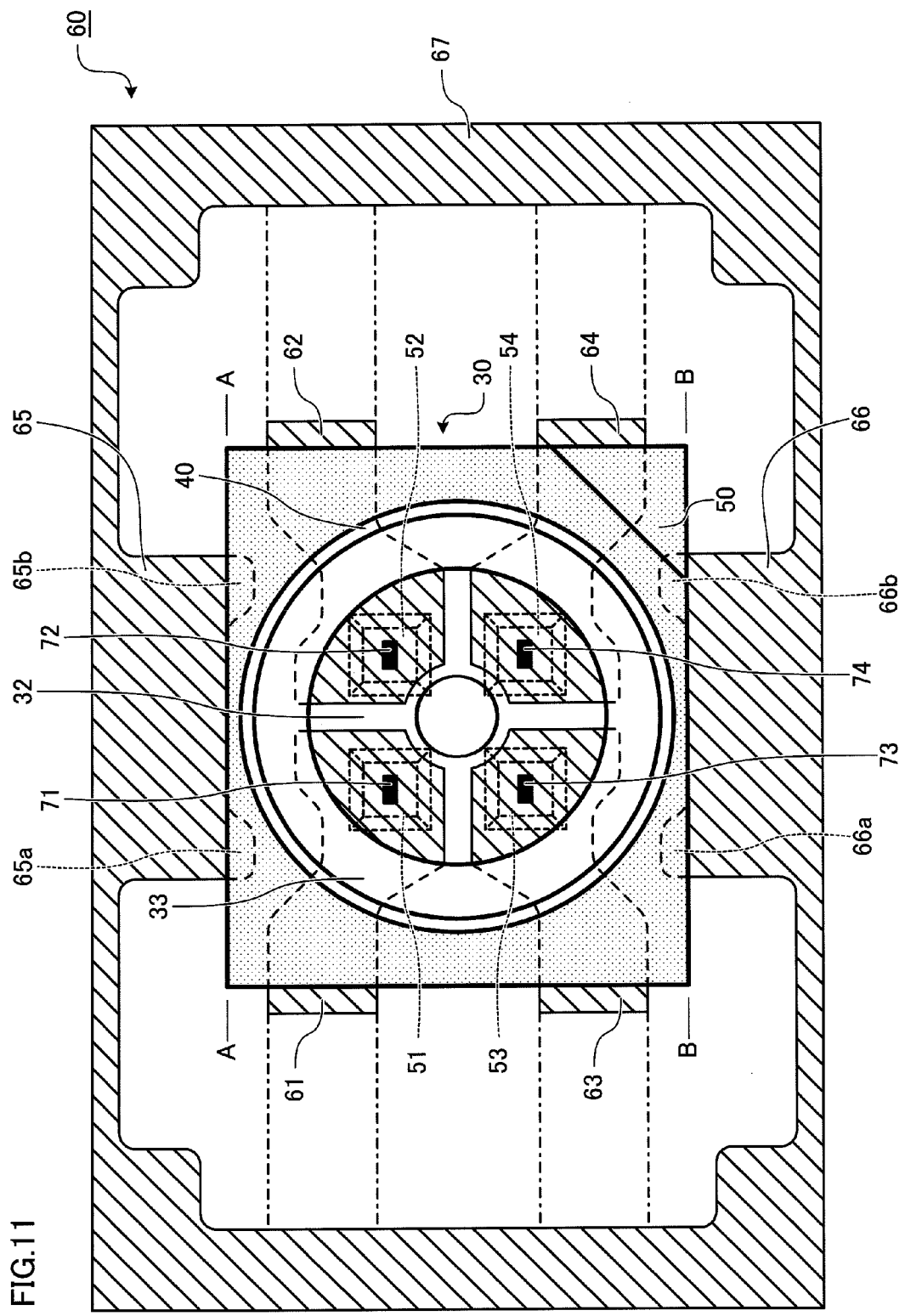
FIG. 11 is a top view of the lead frame with the lead portions thereof cut and bent.

10 . . . lighting device
11 . . . light-emitting module
12 . . . shade
21 . . . substrate
22 . . . light-emitting chip
30 . . . container
31 . . . concave portion
32 . . . bottom surface
33 . . . wall surface
40 . . . first container portion
41 . . . first opening portion
42 . . . second opening portion
43 . . . third opening portion
44 . . . fourth opening portion
50 . . . second container portion
51 . . . first projection portion
52 . . . second projection portion
53 . . . third projection portion
54 . . . fourth projection portion
60 . . . lead frame
61 . . . first lead portion
62 . . . second lead portion
63 . . . third lead portion
64 . . . fourth lead portion
71 . . . first blue LED
72 . . . second blue LED
73 . . . third blue LED
74 . . . fourth blue LED
80 . . . sealing portion

The invention claimed is:

1. A light-emitting device comprising:
a container having a concave portion;
a metal conductor portion provided so as to have one edge exposed to the concave portion of the container and have the other edge exposed to outside of the container; and
a light-emitting element attached to one surface of the metal conductor portion exposed to inside of the concave portion, the light-emitting element being electrically connected to the metal conductor portion, wherein the container includes:
a first container portion provided so as to cover a region of the concave portion to which the metal conductor portion is not exposed, the first container portion forming the concave portion together with the metal conductor portion; and
a second container portion contacting the other surface of the metal conductor portion without being exposed to the concave portion, the second container portion accommodating the first container portion, wherein the first container portion is set to have higher light reflectivity for light emitted from the light-emitting element than the second container portion, and the second container portion is set to have higher thermal conductivity for heat conducted from the light-emitting element than the first container portion.

2. The light-emitting device according to claim 1, wherein the second container portion is in contact with the metal conductor portion on the rear side of the region of the metal conductor portion to which the light-emitting element is attached.

3. The light-emitting device according to claim 1, wherein the first container portion is formed of a resin material whitened by using a white pigment.

4. The light-emitting device according to claim 1, wherein the second container portion is formed of a resin material having a coefficient of thermal conductivity of not less than 2 W/mK nor more than 20 W/mK.

5. The light-emitting device according to claim 1, wherein the first container portion and the second container portion are respectively formed of resin materials having insulation.

6. The light-emitting device according to claim 5, wherein the first container portion and the second container portion respectively have volume resistivities of $10^{15}$ Ωcm or more.

7. A light-emitting module comprising:
a substrate; and
a plurality of light-emitting devices attached to the substrate, wherein
each of the light-emitting devices includes:
a container having a concave portion;
a metal conductor portion provided so as to have one edge exposed to the concave portion of the container and have the other edge exposed to outside of the container; and
a light-emitting element attached to one surface of the metal conductor portion exposed to inside of the concave portion, the light-emitting element being electrically connected to the metal conductor portion, wherein
the container includes:
a first container portion provided so as to cover a region of the concave portion to which the metal conductor portion is not exposed, the first container portion forming the concave portion together with the metal conductor portion; and
a second container portion contacting the other surface of the metal conductor portion without being exposed to the concave portion, the second container portion accommodating the first container portion, wherein
the first container portion is set to have higher light reflectivity for light emitted from the light-emitting element than the second container portion, and
the second container portion is set to have higher thermal conductivity for heat conducted from the light-emitting element than the first container portion.

8. The light-emitting module according to claim 7, wherein the second container portion is in contact with the metal conductor portion on the rear side of the region of the metal conductor portion to which the light-emitting element is attached.

9. The light-emitting module according to claim 7, wherein the first container portion is formed of a resin material whitened by using a white pigment.

10. The light-emitting module according to claim 7, wherein the second container portion is formed of a resin material having a coefficient of thermal conductivity of not less than 2 W/mK nor more than 20 W/mK.

11. The light-emitting module according to claim 7, wherein the first container portion and the second container portion are respectively formed of resin materials having insulation.

12. The light-emitting module according to claim 11, wherein the first container portion and the second container portion respectively have volume resistivities of $10^{15}$ Ωcm or more.

13. A method for manufacturing a light-emitting device, comprising the steps of:
forming a first container portion in a lead frame having a front surface and a rear surface, the first container portion including a concave portion to which the front surface of the lead frame is partially exposed and an opening portion to which the rear surface of the lead frame is partially exposed;
forming a second container portion in the lead frame in which the first container portion is formed, the second container portion including a projection portion contacting the rear surface of the lead frame through the opening portion, the second container portion being not exposed to the concave portion; and
mounting a light-emitting element on the front surface of the lead frame exposed to the concave portion, wherein
in the step of forming the first container portion, the first container portion is formed which has higher light reflectivity for light emitted from the light-emitting element than the second container portion, and
in the step of forming the second container portion, the second container portion is formed which has higher thermal conductivity for heat conducted from the light-emitting element than the first container portion.

14. The method for manufacturing a light-emitting device according to claim 13, wherein in the step of forming the first container portion, the opening portion is formed on the rear side of a position in the lead frame exposed to the concave portion, the position being a target of attachment of the light-emitting element.

15. The method for manufacturing a light-emitting device according to claim 13, wherein in the step of forming the first container portion, the first container portion is formed of a resin material whitened by using a white pigment.

16. The method for manufacturing a light-emitting device according to claim 13, wherein in the step of forming the second container portion, the second container portion is formed of a resin material having a coefficient of thermal conductivity set at not less than 2 W/mK nor more than 20 W/mK by use of a thermally conductive filler.

17. The method for manufacturing a light-emitting device according to claim 13, wherein
in the step of forming the first container portion, the first container portion is formed of a resin material having a volume resistivity of $10^{15}$ Ωcm or more, and
in the step of forming the second container portion, the second container portion is formed of a resin material having a volume resistivity of $10^{15}$ Ωcm or more.

18. The method for manufacturing a light-emitting device according to claim 13, further comprising the step of forming a sealing portion for sealing the light-emitting element in the concave portion on which the light-emitting element is mounted.

* * * * *